(12) United States Patent
Yang

(10) Patent No.: US 12,137,552 B2
(45) Date of Patent: Nov. 5, 2024

(54) SEMICONDUCTOR DEVICE STRUCTURE HAVING MULTIPLE FUSE ELEMENTS

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 393 days.

(21) Appl. No.: 17/545,471

(22) Filed: Dec. 8, 2021

(65) Prior Publication Data

US 2023/0180471 A1 Jun. 8, 2023

(51) Int. Cl.
| | | |
|---|---|---|
| *G11C 17/00* | (2006.01) | |
| *G11C 17/16* | (2006.01) | |
| *G11C 29/00* | (2006.01) | |
| *H01L 23/525* | (2006.01) | |
| *H10B 20/20* | (2023.01) | |

(52) U.S. Cl.
CPC .............. *H10B 20/20* (2023.02); *G11C 17/16* (2013.01); *G11C 29/785* (2013.01); *H01L 23/5256* (2013.01)

(58) Field of Classification Search
CPC ........ H10B 20/20; G11C 17/16; G11C 17/18; H01L 23/5256; H01L 23/5252
See application file for complete search history.

(56) References Cited

U.S. PATENT DOCUMENTS

| | | | |
|---|---|---|---|
| 11,587,632 B1* | 2/2023 | Yang | G11C 29/027 |
| 2005/0154842 A1* | 7/2005 | Smith | G11C 7/1048 |
| | | | 711/154 |
| 2005/0247996 A1* | 11/2005 | Chung | H01G 4/255 |
| | | | 257/532 |
| 2008/0151602 A1* | 6/2008 | Kato | G11C 17/16 |
| | | | 365/148 |
| 2015/0380102 A1 | 12/2015 | Choi et al. | |
| 2016/0181260 A1* | 6/2016 | Lee | G11C 17/18 |
| | | | 365/96 |
| 2020/0075610 A1* | 3/2020 | Wu | H01L 23/5252 |
| 2021/0264997 A1* | 8/2021 | Chu | H10B 20/20 |

FOREIGN PATENT DOCUMENTS

TW 201624493 A 7/2016

* cited by examiner

*Primary Examiner* — Mushfique Siddique
(74) *Attorney, Agent, or Firm* — MUNCY, GEISSLER, OLDS & LOWE, P.C.

(57) ABSTRACT

A semiconductor device structure is provided. The semiconductor device structure includes a first gate structure, a second gate structure, and a first active region. The first gate structure extends along a first direction and is electrically connected to a first transistor. The second gate structure extends along the first direction and is electrically connected to a second transistor. The first active region extends along a second direction different from the first direction and across the first gate structure and the second gate structure. The first gate structure and the first active region collaboratively form a first fuse element. The second gate structure and the first active region collaboratively form a second fuse element.

8 Claims, 13 Drawing Sheets

SEMICONDUCTOR DEVICE STRUCTURE HAVING MULTIPLE FUSE ELEMENTS

TECHNICAL FIELD

The present disclosure relates to a semiconductor device structure, and more particularly to a semiconductor device structure having fuse elements.

DISCUSSION OF THE BACKGROUND

Fuses and e-fuses are commonly used in memory elements to convert a redundant memory cell to a normal memory cell. A test circuit is utilized to determine the status of the fuse (i.e., whether the fuse is blown), such that the corresponding memory cell can be identified as a normal memory cell or a redundant memory cell. As technology develops, the size of the memory cell of semiconductor device structures decreases. Since the size of each component in a semiconductor device structure cannot be reduced without limit, it is crucial to find other approaches to reduce the size of semiconductor device structures.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device structure. The semiconductor device structure includes a first gate structure, a second gate structure, and a first active region. The first gate structure extends along a first direction and is electrically connected to a first transistor. The second gate structure extends along the first direction and is electrically connected to a second transistor. The first active region extends along a second direction different from the first direction and across the first gate structure and the second gate structure. The first gate structure and the first active region collaboratively form a first fuse element. The second gate structure and the first active region collaboratively form a second fuse element.

Another aspect of the present disclosure provides a semiconductor device structure. The semiconductor device structure includes a plurality of fuse elements, a reference resistor unit, a first switching circuit, and a latch circuit. The reference resistor unit is configured to receive a first power signal and electrically couple with the plurality of fuse elements. The first switching circuit is configured to electrically connect the reference resistor unit and the plurality of fuse elements. The latch circuit is configured to read an evaluating signal of a first node between the reference resistor unit and one of the plurality of fuse elements.

Another aspect of the present disclosure provides a semiconductor device structure. The semiconductor device structure includes a plurality of fuse elements, a reference resistor unit, a first conductive terminal, a first switching circuit, and a second switching circuit. Each of the plurality of fuse elements has a first terminal and a second terminal. The reference resistor unit is configured to receive a first power signal and electrically couple with the first terminal of each of the plurality of fuse elements. The first conductive terminal is configured to receive a second power signal and is electrically connected to the second terminal of each of the plurality of fuse elements. The first switching circuit is configured to electrically couple the second terminal of each of the plurality of fuse elements to ground. The second switching circuit is coupled between the reference resistor unit and the ground. In response to the first power signal being applied to the reference resistor unit, and in response to the second power signal being applied to the first conductive terminal, the first switching circuit is configured to establish a first conductive path passing through the reference resistor unit and one of the plurality of fuse elements to the ground. The second switching circuit is configured to establish a second conductive path passing through one of the plurality of fuse elements to the ground.

The reference resistor unit exhibits variable resistance. The variable resistance can be adjusted in accordance with varying resistance of the fuse element, caused by the process variants. According to the actual resistance of the corresponding fuse element, the resistance of the reference resistor can be changed after manufacture is complete. Therefore, the present disclosure provides a device with improved flexibility. With the device having the reference resistor unit, no additional photomask to modify the reference resistor is required. Further, with no need to restart the entire manufacturing process, production time is reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
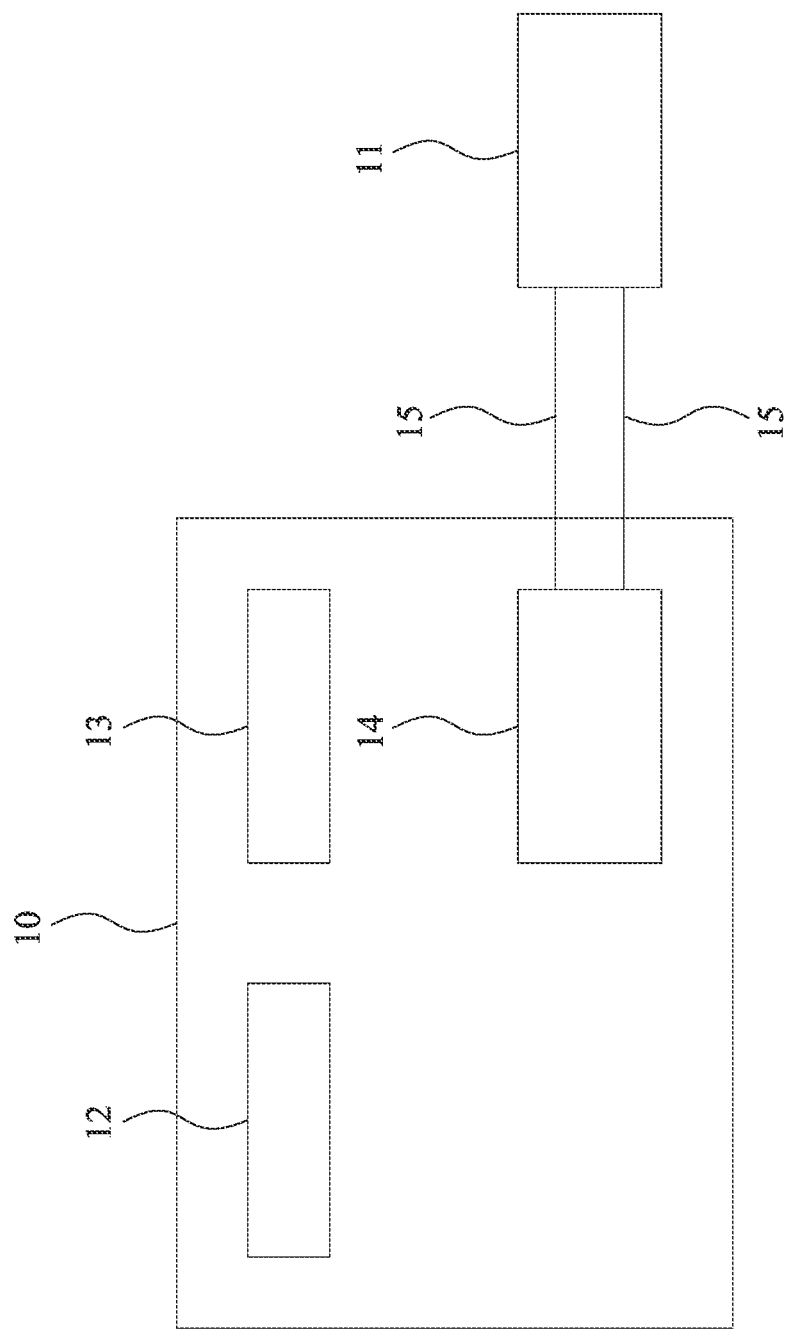
FIG. 1 is a schematic diagram of a system for testing a semiconductor device structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a diagram of a system 10 for testing a semiconductor device, in accordance with some embodiments of the present disclosure.

According to FIG. 1, the system 10 is configured to monitor a semiconductor device structure 11. In some embodiments, the system 10 is configured to test the semiconductor device structure 11. The semiconductor device structure 11 may include a memory, memory device, memory die, or memory chip. In some embodiments, the semiconductor device structure 11 may include one or more memory cells. The semiconductor device structure 11 can be tested after fabrication, and shipped thereafter.

In some embodiments, the system 10 can constitute testing equipment. The system 10 may include hardware and software components that provide a suitable operational and functional environment for testing. In some embodiments, the system 10 may include a signal generator 12, a monitor 13, and a coupler 14.

The signal generator 12 is configured to generate a test signal. In some embodiments, the signal generator 12 can provide a power signal. It should be understood that other electrical signals such as data signals and power signals can further be provided to the semiconductor device structure 11.

The monitor 13 is configured to determine a status of the semiconductor device structure 11. The monitor 13 can be configured to determine a status of a component of the semiconductor device structure 11. The response signals can be identified by the monitor 13 to determine whether a component (e.g., a memory cell) of the semiconductor device structure 11 is a normal device or a redundant device.

The coupler 14 is configured to couple the signal generator 12 to the semiconductor device structure 11. In some embodiments, the coupler 14 can be coupled to the semiconductor device structure 11 by one or more probes 15. The probes 15 can be part of a probe head or probe package (not shown). The probes 15 can be electrically coupled to test conductive terminals (pads) and/or bonding pads disposed on the semiconductor device structure 11. The test conductive pads and/or bonding pads provide electrical connections to an interconnect structure (e.g., wiring) of the semiconductor device structure 11. For example, some of the probes can be coupled to pads that are associated with a power supply terminal (e.g., VDD) and ground terminal (e.g., VSS) of the semiconductor device structure 11. Other probes can be coupled to pads associated with input/output (I/O) terminals (e.g., data signals) of the semiconductor device structure 11. As such, the system 10 is operable to apply electrical signals to the semiconductor device structure 11 and obtain response signals from the semiconductor device structure 11 during testing.

Figure 2:
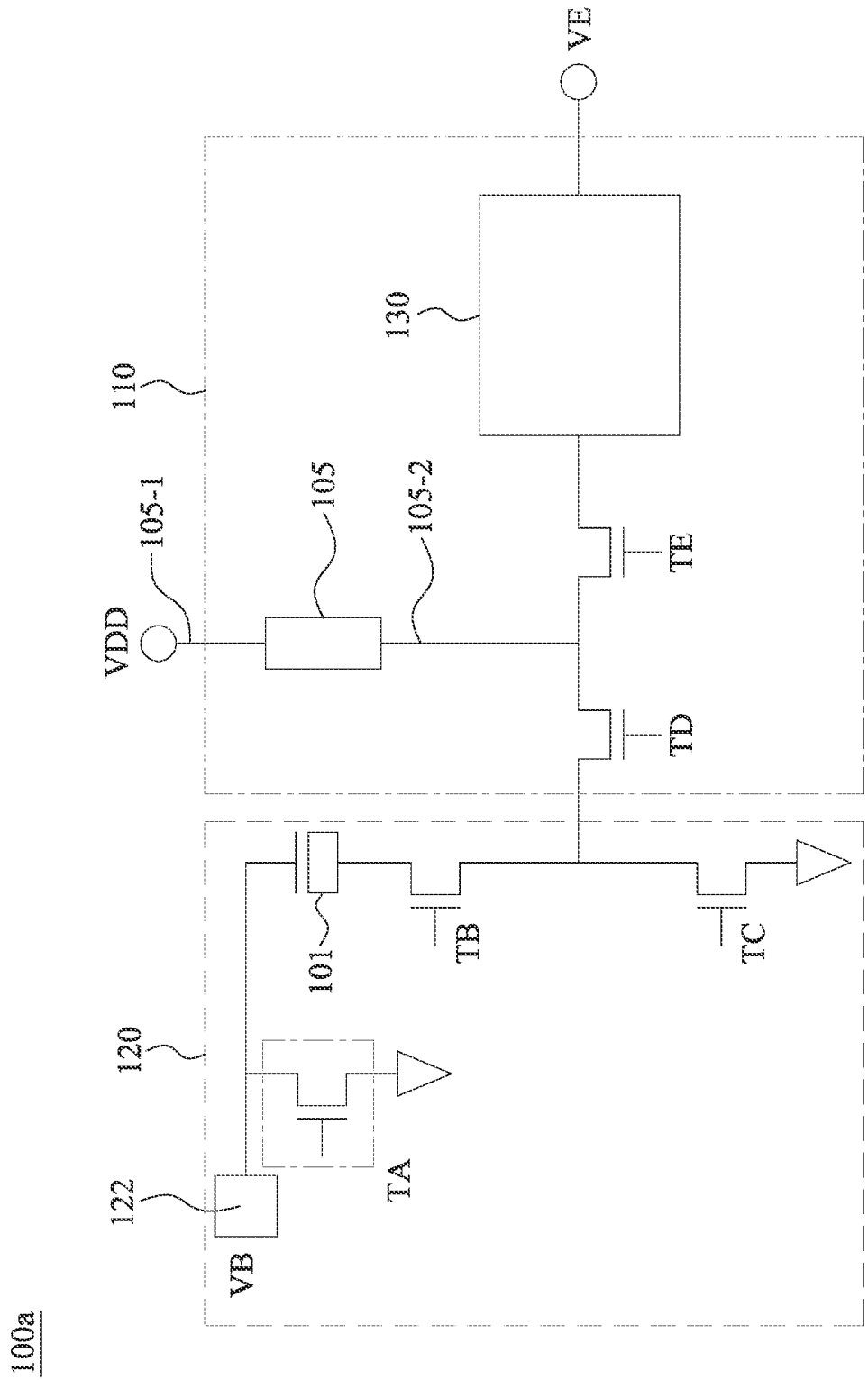
FIG. 2 is a schematic diagram of a semiconductor device structure, in accordance with some embodiments of the present disclosure.

FIG. 2 is a schematic diagram of a semiconductor device structure 100a, in accordance with some embodiments of the present disclosure. The semiconductor device structure 100a can include a memory, memory device, memory die, memory chip or other components. The semiconductor device structure 100a can be a portion of memory, memory device, memory die, or memory chip. For example, the memory can be a dynamic random access memory (DRAM). In some embodiments, the DRAM can be a double data rate four generation (DDR4) DRAM. In some embodiments, the memory includes one or more memory cells (or memory bits, memory blocks). In some embodiments, the memory cell includes a fuse element.

The semiconductor device structure 100a can include a fuse element 101, an evaluating unit 110, and a status-setting unit 120. In some embodiments, the evaluating unit 110 can include a reference resistor unit 105, switching circuits TD and TE, and a latch circuit 130. In some embodiments, the fuse element 101 and the switching circuits TA and TB can act as a portion of the evaluating unit 110. In some embodiments, the status-setting unit 120 can include the fuse element 101, a conductive terminal 122, and two switching circuits TB and TC.

Referring to FIG. 2, the reference resistor unit 105 has a terminal 105-1 configured to receive a power signal VDD. The reference resistor unit 105 has a terminal 105-2 configured to electrically couple with the fuse element 101. In some embodiments, the switching circuit TB can be electrically connected to the fuse element 101. The switching circuit TD can be electrically connected to the reference resistor unit 105. In some embodiments, the switching circuit TD can be electrically connected to the switching circuit TB. In some embodiments, the switching circuit TB can be electrically connected between the switching circuit TB and the reference resistor unit 105. In some embodiments, the fuse element 101 can be coupled to ground through the switching circuits TB and TC. The switching circuit TA can be electrically connected to the fuse element 101. The switching circuit TA can be electrically connected to ground.

In some embodiments, the latch circuit 130 is electrically coupled to the reference resistor unit 105. The latch circuit 130 can be electrically coupled to the fuse element 101 through the switching circuits TB, TD, and TE. In some embodiments, the switching circuit TE is electrically connected to the reference resistor unit 105. The switching circuit TE can be electrically connected to the latch circuit 130. In some embodiments, the switching circuit TE can be electrically connected to the switching circuit TD. An evaluation/output signal may be obtained at a conductive terminal VE of the latch circuit 130.

Referring to FIG. 2, the conductive terminal 122 can be electrically connected to the fuse element 101. The conductive terminal 122 may be a test pad, a probe pad, a conductive pad, a conductive terminal, or other suitable elements. In some embodiments, the conductive terminal 122 is configured to receive a status-setting signal VB. In some embodiments, the switching circuit TB can be electrically connected to the fuse element 101. The switching circuit TC can be electrically connected to the switching circuit TB. The switching circuit TB can be electrically connected between the switching circuit TC and the fuse element 101. The switching circuit TC can be electrically connected to ground.

In some embodiments, each of the switching circuits TA, TB, TC, TD, and TE can be a switch, transistor, or other switchable circuits.

Figure 2A:
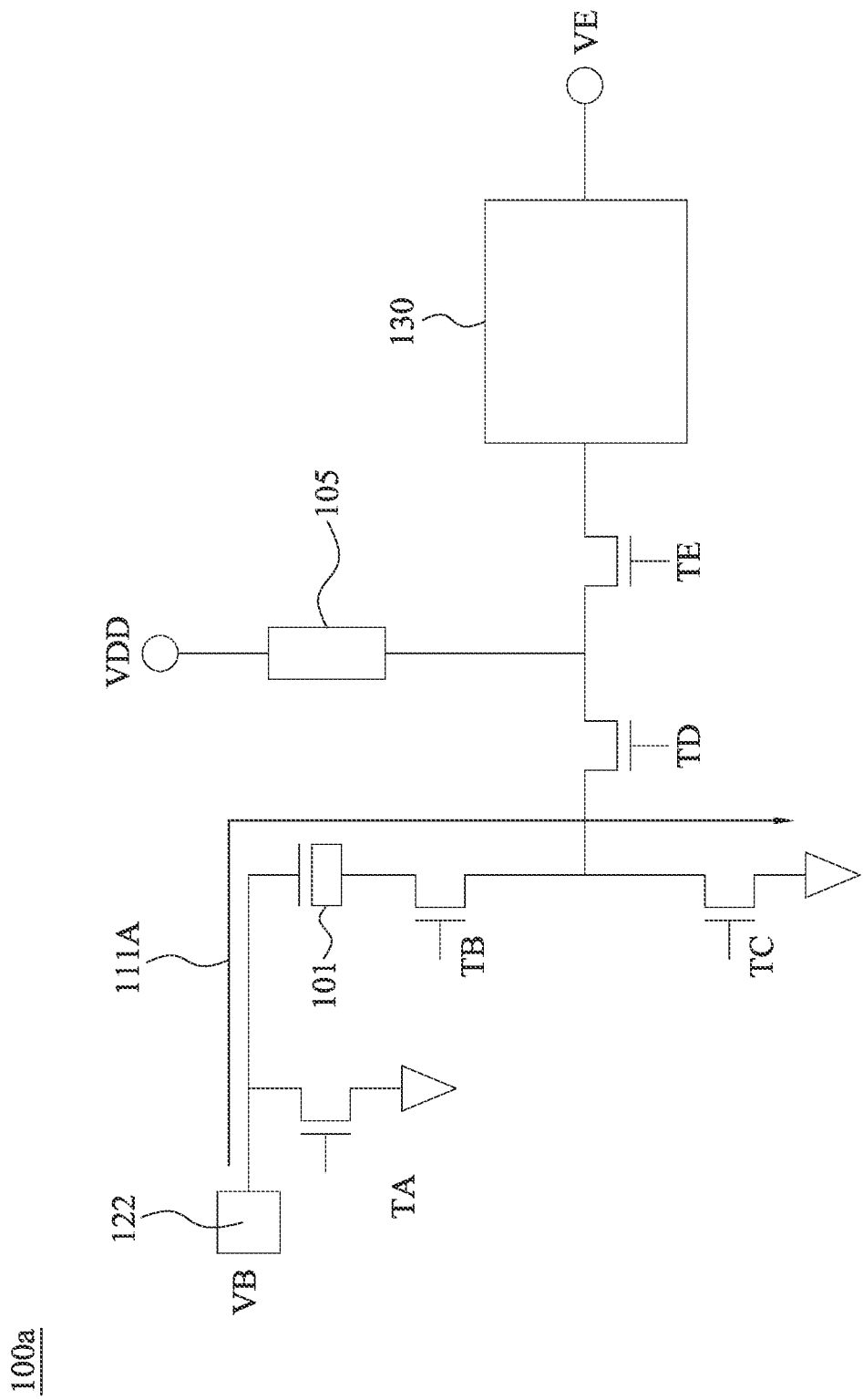
FIG. 2A is a schematic diagram of a semiconductor device structure, in accordance with some embodiments of the present disclosure.

FIG. 2A shows a semiconductor device structure 100a, in accordance with some embodiments of the present disclosure. In some embodiments, the switching circuits TB and TC are configured to be turned on to establish a conductive path 111A in response to the status-setting signal VB. In some embodiments, the conductive path 111A can pass through the fuse element 101 to ground in response to the status-setting signal VB. In some embodiments, when the status-setting signal VB is applied to the conductive terminal 122, the conductive path 111A passes through the fuse element 101, the switching circuits TB and TC, and to ground in order. In addition, the switching circuits TA, TD, and TE can be configured to be turned off, such that the conductive path 111A can pass through the fuse element 101.

In some embodiments, the status-setting signal VB may be a voltage signal or a current signal. In some embodiments, the status-setting signal VB may be a voltage signal having a voltage exceeding the normal operating voltage of the semiconductor device structure 100a. In some embodiments, the status-setting signal VB can have a voltage in a range of 4-6V. In one embodiment, the status-setting signal VB can have a voltage in a range of 5-6V. When the status-setting signal VB is applied, a status of the fuse element 101 may be changed. For example, the status-setting signal VB can be configured to burn down a 206 layer of the fuse element 101. After the 206 layer of the fuse element 101 is burned down, the physical property, such as resist, density or other properties, of the 206 layer of the fuse element 101 is changed. Before the status-setting operation, the fuse element 101 may have a relatively high resistance. After the status-setting operation, the fuse element 101 may have a relatively low resistance. In the present disclosure, a fuse element before the status-setting operation can be referred to as an "unblown" fuse element, and a fuse element after the status-setting operation can be referred to as a "blown" fuse element.

The blown fuse element 101 has a resistance lower than the resistance of the unblown fuse element 101. In some embodiments, the fuse element 101 can be an anti-fuse. For example, the anti-fuse may be an e-fuse. In some embodiments, the anti-fuse includes a polysilicon e-fuse or other type of anti-fuse.

In one embodiment, the resistance of the unblown fuse element 101 can be in a range of 1.5M to 20MΩ. In another embodiment, the resistance of the unblown fuse element 101 may be in a range of 5M to 20MΩ. In some embodiments, the resistance of the unblown fuse element 101 may exceed 20MΩ. After the status-setting operation, the resistance of the blown fuse element 101 can be around 2 k to 800 kΩ. In one embodiment, the resistance of the blown fuse element 101 can be around 2 k to 20 kΩ. In another embodiment, the resistance of the blown fuse element 101 may exceed 100 kΩ. In some embodiments, the resistance of the blown fuse element 101 can be around 100 k to 800 kΩ.

Figure 2B:
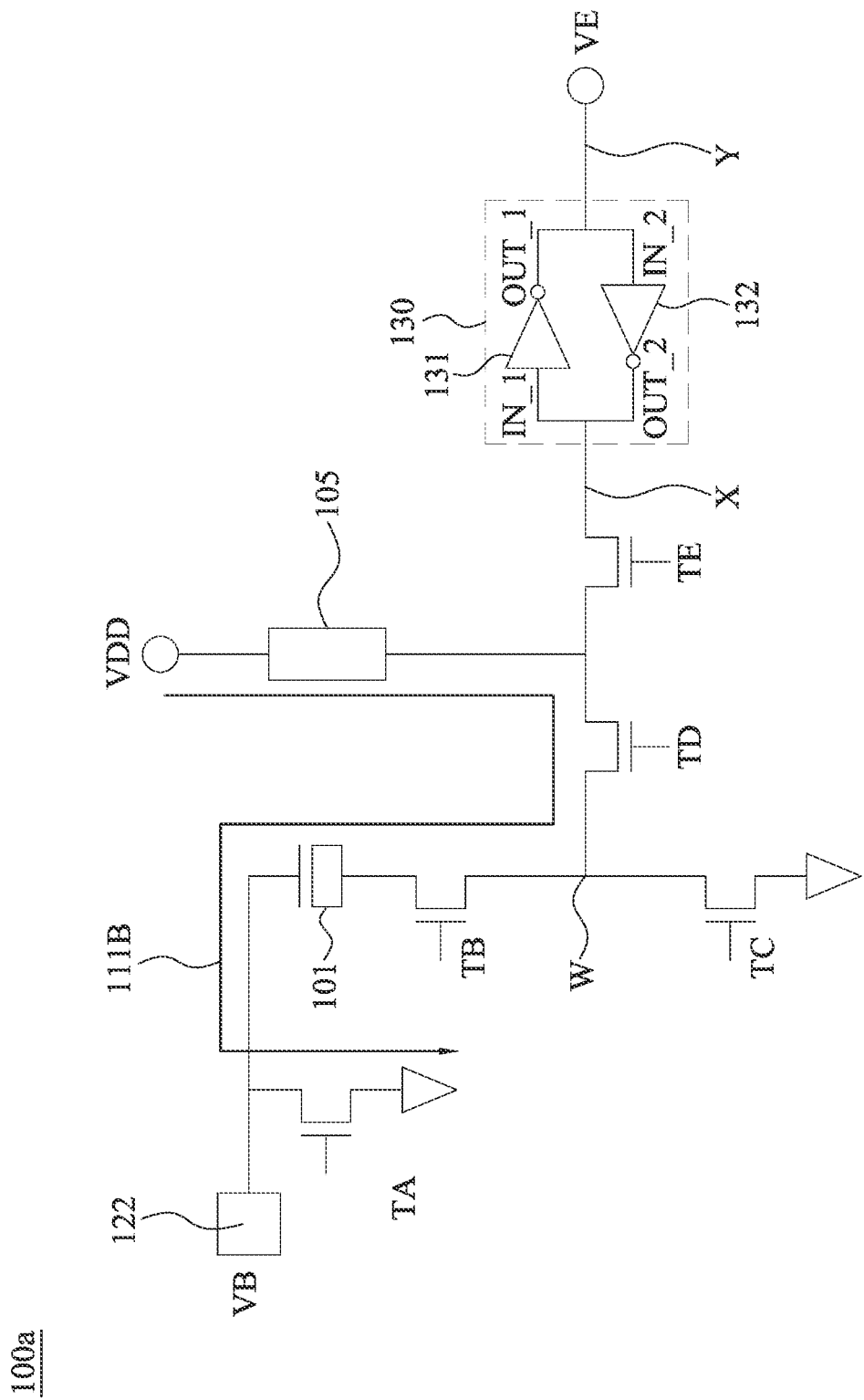
FIG. 2B is a schematic diagram of a semiconductor device structure, in accordance with some embodiments of the present disclosure.

FIG. 2B is a schematic diagram of a semiconductor device structure 100a, in accordance with some embodiments of the present disclosure. In some embodiments, the switching circuits TA, TB and TD are configured to be turned on to establish a conductive path 111B. In some embodiments, the conductive path 111B can pass through the reference resistor unit 105 and the fuse element 101 to ground in response to the power signal VDD. In some embodiments, the switching circuit TC is configured to be turned off so as to establish the conductive path 111B. In some embodiments, when the power signal VDD is applied to the terminal 105-1 of the reference resistor unit 105, the conductive path 111B passes through the reference resistor unit 105, the switching circuits TD and TB, the fuse element 101, and the switching circuit TA to ground, in that order. In some embodiments, the power signal VDD can be a normal operating voltage. In some embodiments, the power provided by the power signal VDD can be less than that of the status-setting signal VB. For example, the power signal VDD can have a voltage of around 1.2V.

In some embodiments, a signal X is generated at a node W between the reference resistor 105 and the fuse element 101, in response to the power signal VDD. Referring to FIG. 2B, the signal X generated at the node W can be transmitted to the latch circuit 130, through the switching circuits TD and TE.

In some embodiments, the latch circuit 130 is configured to read the signal X generated at the node W between the reference resistor 105 and the fuse element 101. The node W is between the reference resistor 105 and the fuse element 101 with or without other elements coupled therebetween. For example, the node W may be between the switching circuits TB and TD. In one embodiment, the node W may be between the switching circuit TD and the reference resistor unit 105. In another embodiment, the node W may be between the switching circuit TB and the fuse element 101. In some embodiments, the signal X may include a voltage signal or a current signal.

In some embodiments, the switching circuit TE is configured to be turned on to transmit the signal X to the latch circuit 130. During an evaluation period, when the switching circuits TA, TB, TD, and TE are configured to be turned on to establish the conductive path 111B, the signal X can be obtained at the node W and transmitted to the latch circuit 130. In some embodiments, the latch circuit 130 can read the signal X. In some embodiments, the latch circuit 130 can transform the signal X into a signal Y. For example, the transformation of the signal X operated by the latch circuit 130 may include converting or inverting one signal into another. In one embodiment, the transformation of the signal X operated by the latch circuit 130 may include phase shifting. In another embodiment, the transformation of the signal X operated by the latch circuit 130 may include amplification.

In some embodiments, the latch circuit 130 can convert the analog signal X to a logic signal Y. The latch circuit 130 can compare the signal X with a threshold, and, based on the result of the comparison between the signal X and the threshold, output the signal Y. For example, when the signal X exceeds the threshold, the latch circuit 130 may output a logic low signal Y. On the contrary, when the signal X is lower than the threshold, the latch circuit 130 may output a logic high signal Y. In some embodiments, the signal Y has a logic value opposite to that of the signal X. For example, when the signal X is logic "0," the signal Y will be logic "1." On the contrary, when the signal X is logic "1," the signal Y will be logic "0." In some embodiments, the latch circuit 130 can store the signal Y.

Referring to FIG. 2B, the latch circuit 130 can include two inverters 131 and 132. In some embodiments, the latch circuit 130 can include more than two inverters. In some embodiments, the latch circuit 130 may be a latch circuit of another type. The inverter 131 has an input terminal IN_1 and an output terminal OUT_1. The inverter 132 has an input terminal IN_2 and an output terminal OUT_2. In some embodiments, the input terminal IN_1 of the inverter 131 can be coupled to the reference resistor unit 105, through the switching circuit TE. The input terminal IN_1 of the inverter 131 can be coupled to the fuse element 101, through the switching circuits TB, TD, and TE. The output terminal OUT_1 of the inverter 131 can be coupled to the conductive terminal VE. In some embodiments, the input terminal IN_1 of the inverter 131 may connect to the output terminal OUT_2 of the inverter 132. The output terminal OUT_1 of the inverter 131 may connect to the input terminal IN_2 of the inverter 132. That is, the input terminal IN_2 of the inverter 132 can be coupled to the conductive terminal VE. The output terminal OUT_2 of the inverter 132 can be coupled to the reference resistor unit 105. The output terminal OUT_2 of the inverter 132 can be coupled to the fuse element 101.

To evaluate the status of the fuse element 101 (i.e., whether the fuse element 101 is blown), the signal X (or signal Y) is monitored. The signal X is dependent on the resistance of the fuse element 101. The signal X is compared with a predetermined signal or a threshold. Based on the comparison of the signal X and the predetermined signal, the logic signal Y can be output at the conductive terminal VE. When the signal X exceeds the predetermined signal, it indicates that the fuse element 101 is not blown. When the signal X fails to exceed the predetermined signal, it indicates that the fuse element 101 is blown.

In some embodiments, if the signal X exceeds the predetermined signal, the latch circuit 130 can output a logic low signal Y. That is, the logic low signal Y indicates that the fuse element 101 is not blown. When the signal X is lower than the predetermined signal, the latch circuit 130 may output a logic high signal Y. In other words, logic high signal Y indicates that the fuse element 101 is blown.

The signal Y may be obtained at the conductive terminal VE, such that the status of the fuse element 101 can be determined. The status of the fuse element 101 can be utilized to determine whether the semiconductor device structure is a redundant device or a normal device.

Figure 2C:
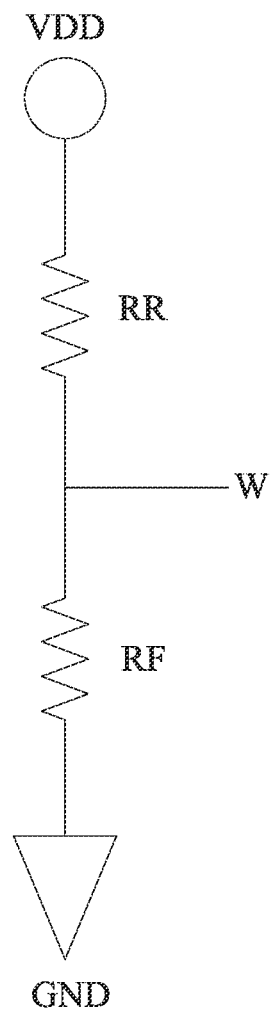
FIG. 2C illustrates an equivalent circuit of a portion of the semiconductor device shown in FIG. 2B, in accordance with some embodiments of the present disclosure.

FIG. 2C illustrates an equivalent circuit 20 of a portion of the semiconductor device structure 100a when the conductive path 111B is established, in accordance with the embodiments of the subject disclosure. The equivalent circuit 20 is in configuration with switching circuits TA, TB and TD when they are on and in configuration with the switching circuit TC when it is off. In other words, the equivalent circuit 20 presents a simplified circuit through which the conductive path 111B passes.

The equivalent circuit 20 includes two resistors RR and RF. In some embodiments, the resistor RR can be the resistance of the reference resistor unit 105. The resistor RF can be the resistance of the fuse element 101. In some embodiments, the resistor RR can be connected to the resistor RF in series. A node W is between the resistor RR and the resistor RF. That is, the node W in FIG. 2C corresponds to the node in FIG. 2B. In some embodiments, the resistor RR is configured to receive a power signal VDD. For example, the power signal VDD may be a voltage of 1.2V. In some embodiments, the resistor RF is connected to the resistor RR and the ground.

Referring to FIG. 2C, the signal X may be a voltage signal obtained at the node W. Therefore, the signal X can be calculated according to equation 1.

$$X = \frac{RF}{RR + RF} VDD, \qquad \text{[Equation. 1]}$$

In equation 1, X represents the voltage of the signal X; RR represents the resistance of the reference resistor unit 105; RF represents the resistance of the fuse element 101; and VDD represents the power signal.

To evaluate the status of the fuse element 101 accurately, the resistance RR can fall below the resistance RF of the unblown fuse element. In addition, the resistance RR can exceed the resistance RF of the blown fuse element. In some embodiments, the resistance RR may be between the resistance of the unblown fuse element and the resistance of the blown fuse element.

In one embodiment, the resistance of the unblown fuse element 101 can be in a range of 1.5M to 20MΩ. In another embodiment, the resistance of the unblown fuse element 101 may be in a range of 5M to 20MΩ. In some embodiments, the resistance of the unblown fuse element 101 may exceed 20MΩ. After the status-setting operation, the resistance of the blown fuse element 101 can be 2 k to 800 kΩ. In one embodiment, the resistance of the blown fuse element 101 can be 2 k to 20 kΩ. In another embodiment, the resistance of the blown fuse element 101 may exceed 100 kΩ. In some embodiments, the resistance of the blown fuse element 101 can be 100 k to 800 kΩ.

In some embodiments, the predetermined signal has a voltage less than that of the power signal VDD. In some embodiments, the predetermined signal has a voltage, which fractionally multiplies the power signal VDD. For example, if the predetermined signal has a voltage half of the power signal VDD, for example of 1.2V, the predetermined signal can have a voltage of 0.6V. That is, when the result of the equation 1 exceeds 0.6V, the signal X at the node W would be determined as logic high, indicating that the fuse element 101 is not blown, and when less than 0.6V, the signal X at the node W would be determined as logic low, indicating that the fuse element 101 is blown.

Figure 3:
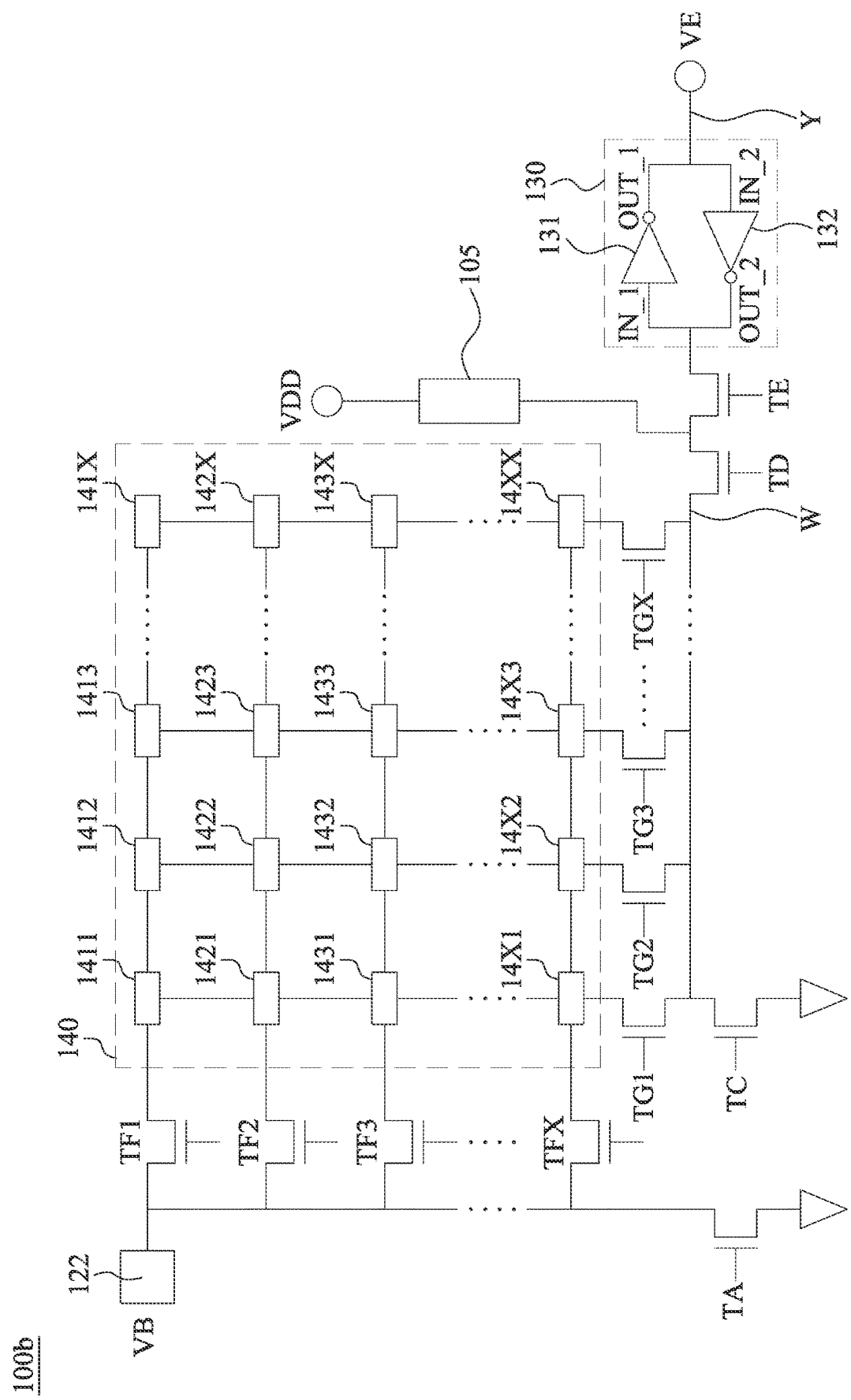
FIG. 3 is a schematic diagram of a semiconductor device structure, in accordance with some embodiments of the present disclosure.

FIG. 3 is a schematic diagram of a semiconductor device structure 100b, in accordance with some embodiments of the present disclosure. The semiconductor device structure 100b is similar to the semiconductor device structure 100a as shown in FIG. 1, differing in that the semiconductor device structure 100b can include a fuse structure 140.

In some embodiments, the fuse structure 140 can include a plurality of fuse elements. In some embodiments, the fuse elements of the fuse structure 140 can form an n×n array. For example, the fuse structure 140 can include fuse elements 1411, 1412, 1413, . . . , and 141X forming the first row. X can be a positive integer ranging from 1 to n. The fuse structure 140 can include fuse elements 1421, 1422, 1423, . . . , and 142X forming the second row. The fuse structure 140 can include fuse elements 1431, 1432, 1433, . . . , and 143X forming the third row. The fuse structure 140 can include fuse elements 14X1, 14X2, 14X3, . . . , and 14XX form the Xth row. Further, the fuse elements 1411, 1421, 1431, . . . , and 14X1 form the first column. The fuse elements 1412, 1422, 1432, . . . , and 14X2 form the second column. The fuse elements 1413, 1423, 1433, . . . , and 14X3 form the third column. The fuse elements 141X, 142X, 143X, . . . , and 14XX form the Xth column.

In some embodiments, the semiconductor device structure 100b can include a plurality of transistors, such as transistors TF1, TF2, TF3 and TFX. The transistors TF1-TFX can be configured to turn on or turn off the row of the fuse structure 140. For example, the transistors TF1-TFX can be electrically connected to the fuse elements 1411-141X, 1421-142X, 1431-143X, and 14X1-14XX, respectively. The transistors, such as TF1-TFX, can be electrically connected between the conductive terminal 122 and the fuse structure 140.

In some embodiments, the semiconductor device structure 100b can include a plurality of transistors, such as transistors TG1, TG2, TG3 and TGX. The transistors TG1-TGX can be configured to turn on or turn off the column of the fuse structure 140. For example, the transistors TG1-TGX can be electrically connected to the fuse elements 1411-14X1, 1412-14X2, 1413-14X3, and 141X-14XX, respectively. The transistors TG1-TGX can be electrically connected between the switching circuit TD and the fuse structure 140.

In some embodiments, the fuse structure 140 shares one switching circuit TA. In some embodiments, the fuse structure 140 shares one switching circuit TC. In some embodiments, the fuse structure 140 shares one switching circuit TD. In some embodiments, the fuse structure 140 shares one reference resistor unit 105. In some embodiments, the fuse structure 140 shares one latch circuit 130. In comparison with the semiconductor device structure 100a shown in FIG. 2, of which one switching circuit TA, TC or TD is electrically coupled to merely one fuse element 101, the semiconductor device structure 100b can have a relatively small size.

Figure 3A:
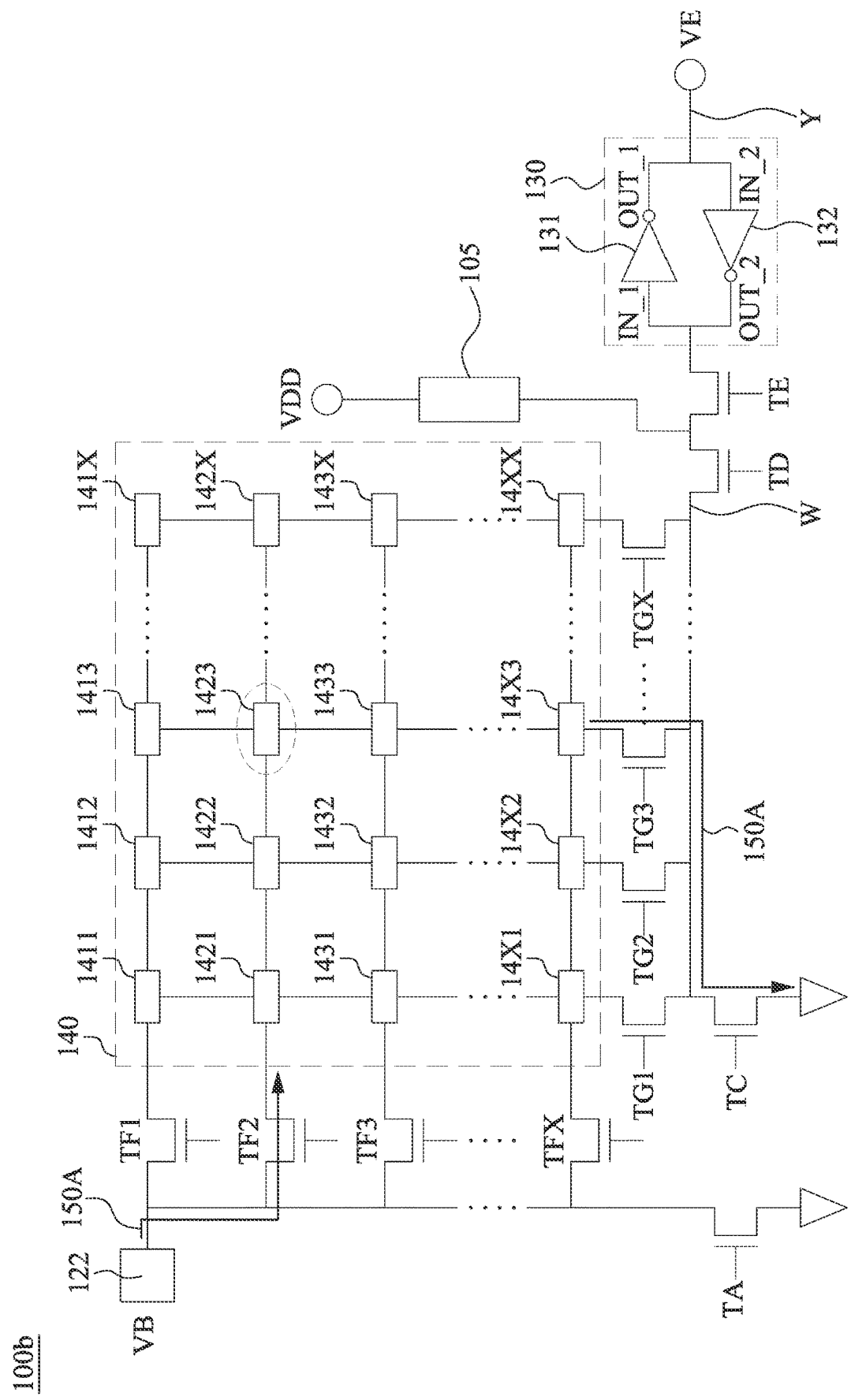
FIG. 3A is a schematic diagram of a semiconductor device structure, in accordance with some embodiments of the present disclosure.

FIG. 3A is a schematic diagram of a semiconductor device structure 100b, in accordance with some embodiments of the present disclosure.

In some embodiments, one of the transistors (e.g., transistor TF1, TF2, TF3 or TFX), one of the fuse elements 1411-14XX, one of the transistors (e.g., transistor TG1, TG2, TG3 or TGX), and the switching circuit TC are configured to be turned on to establish a conductive path 150A in response to the status-setting signal VB. In some embodiments, the conductive path 150A can pass through one of the fuse elements 1411-14XX to ground in response to the status-setting signal VB. For example, when the transistors TF2 and TG3 are turned on, the conductive path 150A will pass through the transistor TF2, fuse element 1423, the transistor TG3 and the switching circuit TC and to ground, in that order. In addition, the switching circuits TA, TD, and TE can be configured to be turned off, such that the conductive path 150A can pass through one of the fuse elements 1411-14XX.

In some embodiments, the status-setting signal VB may be a voltage signal or a current signal. In some embodiments, the status-setting signal VB may be a voltage signal having a voltage exceeding the normal operating voltage of the semiconductor device structure 100b. In some embodiments, the status-setting signal VB can have a voltage in a range of 4-7V, such as 4V, 4.5V, 5V, 5.5V, 6V, 6.5V or 7V. When the status-setting signal VB is applied, a status of one of the fuse elements 1411-14XX may be changed. For example, the status-setting signal VB can be configured to burn down a gate dielectric layer (not shown) of the one of the fuse elements 1411-14XX. Before the status-setting operation, the fuse elements 1411-14XX may have a relatively high resistance. After the status-setting operation, the transistor (e.g., the transistor 1423) through which the conductive path 150A passes may have a relatively low resistance in comparison with other transistors (e.g., the transistors 1411).

Figure 3B:
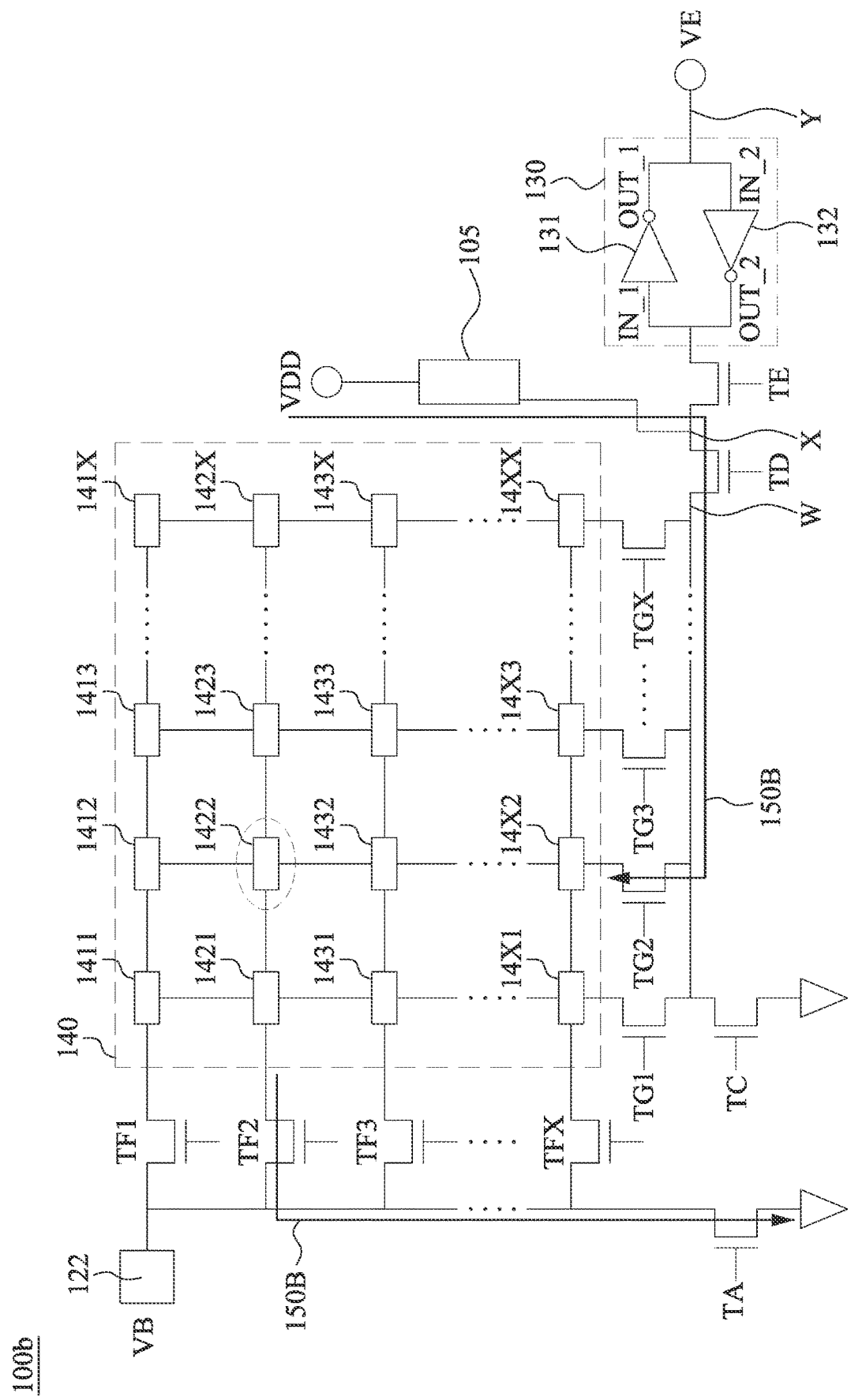
FIG. 3B is a schematic diagram of a semiconductor device structure, in accordance with some embodiments of the present disclosure.

FIG. 3B is a schematic diagram of a semiconductor device structure 100b, in accordance with some embodiments of the present disclosure.

In some embodiments, one of the transistors (e.g., transistor TF1, TF2, TF3 or TFX), one of the fuse elements 1411-141X, one of the transistors (e.g., transistor TG1, TG2, TG3 or TGX), and the switching circuits TA and TD are configured to be turned on to establish a conductive path 150B. In some embodiments, the conductive path 150B can pass through the reference resistor unit 105 and one of the fuse elements 1411-141X to ground in response to the power signal VDD. In some embodiments, the conductive path 150B passes through the reference resistor unit 105, the switching circuit TD, one of the transistors (e.g., the transistor TG1, TG2, TG3 or TGX), one of the fuse elements 1411-141X, one of the transistors (e.g., the transistor TF1, TF2, TF3 or TFX) and the switching circuit TA to ground, in that order. For example, when the transistors TF2 and TG2 are turned on, the conductive path 150B will pass through the switching circuit TD, transistor TG2, fuse element 1422, transistor TF2 and switching circuit TA and to ground, in that order. In some embodiments, the switching circuit TC is configured to be turned off so as to establish the conductive path 150B.

In some embodiments, the power signal VDD can be a normal operating voltage. In some embodiments, the power provided by the power signal VDD can be less than that of the status-setting signal VB. For example, the power signal VDD can have a voltage ranging from 1-1.5V, such as 1V, 1.1V, 1.2V, 1.3V, 1.4V or 1.5V.

In some embodiments, a signal X is generated at a node W between the reference resistor unit 105 and one of the fuse elements 1411-14XX, in response to the power signal VDD. Referring to FIG. 3B, the signal X generated at the node W can be transmitted to the latch circuit 130, through the switching circuits TD and TE.

In some embodiments, the latch circuit 130 is configured to read the signal X generated at the node W between the reference resistor unit 105 and one of the fuse elements 1411-14XX. The node W is between the reference resistor unit 105 and one of the fuse elements 1411-14XX with or without other elements coupled therebetween. For example, the node W may be between one of the transistors (e.g., the transistor TG1, TG2, TG3 or TGX) and the switching circuit TD. In one embodiment, the node W may be between the switching circuit TD and the reference resistor unit 105. In some embodiments, the signal X may include a voltage signal or a current signal.

In some embodiments, the switching circuit TE is configured to be turned on to transmit the signal X to the latch circuit 130. During an evaluation period, when the switching circuits TA, TD, and TE as well as transistors TGX and TFX are configured to be turned on to establish the conductive path 150B, the signal X can be obtained at the node W and transmitted to the latch circuit 130.

To evaluate the status of one of the fuse elements 1411-14XX (i.e., whether one of the fuse elements 1411-14XX is blown), the signal X (or signal Y) is monitored. The signal X is dependent on the resistance of one of the fuse elements 1411-14XX. The signal X is compared with a predetermined signal or a threshold. Based on the comparison of the signal X and the predetermined signal, the logic signal Y can be output at the conductive terminal VE. When the signal X exceeds the predetermined signal, it indicates that the one of the fuse elements 1411-14XX is not blown. When the signal X fails to exceed the predetermined signal, it indicates that the one of the fuse elements 1411-14XX is blown.

In some embodiments, if the signal X exceeds the predetermined signal, the latch circuit 130 can output a logic low signal Y. That is, the logic low signal Y indicates that the one of the fuse elements 1411-14XX is not blown. When the signal X is lower than the predetermined signal, the latch circuit 130 may output a logic high signal Y. In other words, logic high signal Y indicates that the one of the fuse elements 1411-14XX is blown.

The signal Y may be obtained at the conductive terminal VE, such that the status of the one of the fuse elements 1411-14XX can be determined. The status of the one of the fuse elements 1411-14XX can be utilized to determine whether the semiconductor device structure is a redundant device or a normal device.

For example, the fuse element 1423 is blown when the conductive path 150A is established as shown in FIG. 3A. In this case, the signal X, which is generated at the node W between the reference resistor unit 105 and the fuse element 1423, will fail to exceed the predetermined signal. As a result, the latch circuit 130 will output a logic high signal Y.

Figure 4:
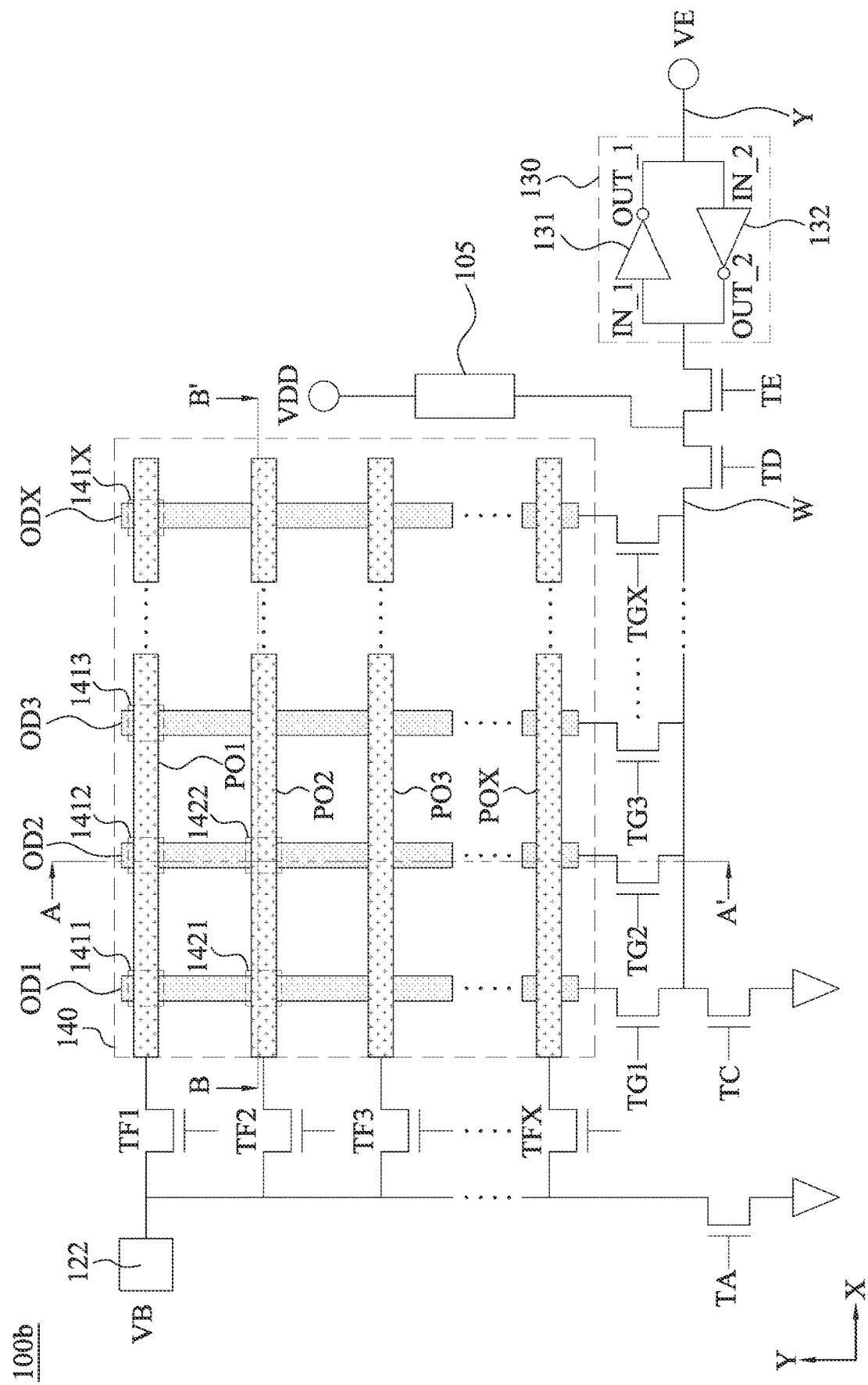
FIG. 4 is a schematic diagram of a layout of fuse elements of the semiconductor device structure shown in FIG. 3, in accordance with some embodiments of the present disclosure.

FIG. 4 is a schematic diagram of a layout of the fuse structure 140 of the semiconductor device structure 100b shown in FIG. 3, in accordance with some embodiments of the present disclosure.

In some embodiments, the semiconductor device structure 100b can include a plurality of gate structures (e.g., the gate structures PO1, PO2, PO3, . . . , and POX) extending along the X direction. In some embodiments, the semiconductor device structure 100b can include a plurality of active regions (e.g., the active regions OD1, OD2, OD3, . . . , and ODX) extending along the Y direction. Each one of the active regions OD1, OD2, OD3 and ODX can cross the gate structures PO1-POX. One of the gate structures PO1-POX and one of the active regions OD1-ODX can collaboratively form or define a fuse element. For example, the gate structure PO1 can overlap the active region OD1, and thus the overlapping area of the gate structure PO1 and the active region OD1 can define the fuse element 1411.

In some embodiments, each of the gate structures PO1-POX can serve as the first terminal of the one of the fuse elements 1411-14XX. In some embodiments, each of the gate structures PO1-POX can be electrically connected to one of the corresponding transistors TF1-TFX, respectively. In some embodiments, each of the active regions OD1-ODX can serve as the second terminal of the one of the fuse elements 1411-14XX. In some embodiments, each of the active regions OD1-ODX can be electrically connected to one of the corresponding transistors TG1-TGX, respectively. For example, the gate structure PO1 can serve as the first terminal of the fuse element 1412 and is electrically connected to the transistor TF1. The active region OD2 can serve as the second terminal of the fuse element 1412 and is electrically connected to the transistor TG2.

Figure 5A:
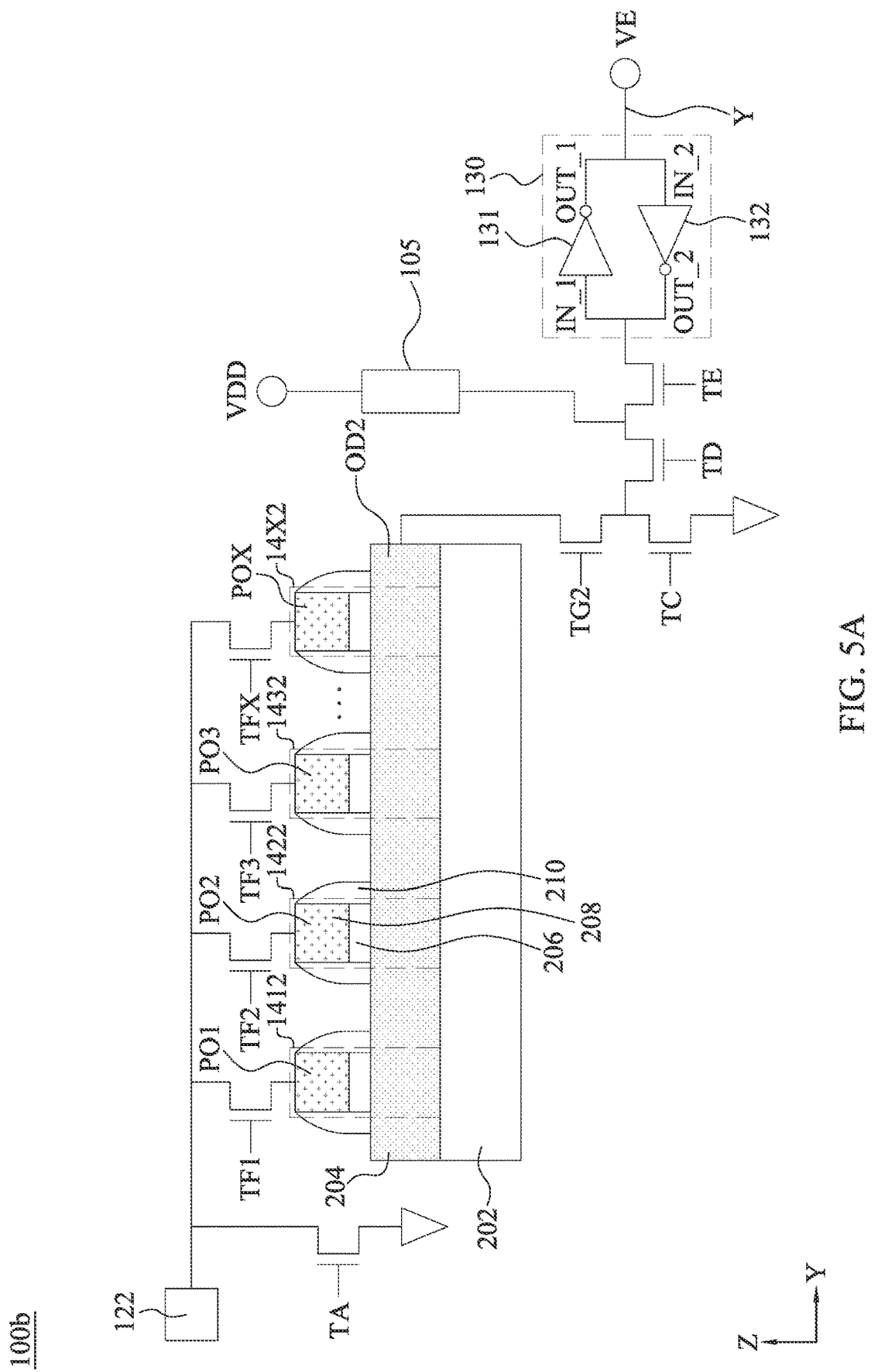
FIG. 5A illustrates a cross-sectional view along the line A-A' of the semiconductor device structure shown in FIG. 4, in accordance with some embodiments of the present disclosure.

FIG. 5A illustrates a cross-sectional view along the line A-A' of the semiconductor device structure 100b shown in FIG. 4, in accordance with some embodiments of the present disclosure.

As shown in FIG. 5A, the semiconductor device structure 100b can include a substrate 202, a doped region 204, a gate dielectric layer 206, a gate electrode 208, and a spacer 210.

The substrate 202 may be a semiconductor substrate, such as a bulk semiconductor, a semiconductor-on-insulator (SOI) substrate, or the like. The substrate 202 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 202 may have a multilayer structure, or the substrate 202 may include a multilayer compound semiconductor structure.

The doped region 204 can be disposed within the substrate 202. In some embodiments, the doped region 204 can be a semiconductor material doped with dopants. The dopants can include p-type and/or n-type dopants. In some embodiments, p-type dopants can include boron (B), other group III elements, or any combination thereof. In some embodiments, n-type dopants can include arsenic (As), phosphorus (P), other group V elements, or any combination thereof. In some embodiments, the doped region 204 can define the active region OD1-ODX.

The gate dielectric layer 206 can be disposed on the substrate 202 and over the doped region 204. The gate dielectric layer 206 can have a single layer or a multi-layer structure. In some embodiments, the gate dielectric layer 206 can include dielectric material such as silicon oxide, silicon nitride, silicon oxynitride, other dielectric materials, or a combination thereof. In some embodiments, the gate dielectric layer 206 is a multi-layer structure that includes an interfacial layer and a high-k (dielectric constant greater than 4) dielectric layer. The interfacial layer can include dielectric material such as silicon oxide, silicon nitride, silicon oxynitride, other dielectric materials, or a combination thereof. The high-k dielectric layer can include high-k dielectric material such as $HfO_2$, HfSiO, HfSiON, HfTaO, HfTiO, HfZrO, other suitable high-k dielectric materials, or a combination thereof. In some embodiments, the high-k dielectric material can further be selected from metal oxides, metal nitrides, metal silicates, transition metal-oxides, transition metal-nitrides, transition-metal silicates, metal oxynitrides, metal aluminates, and combinations thereof.

The gate electrode 208 is disposed on the gate dielectric layer 206. The gate electrode 208 can include polysilicon, silicon-germanium, and at least one metallic material including elements and compounds such as Mo, Cu, W, Ti, Ta, TiN, TaN, NiSi, CoSi, or other suitable conductive materials known in the art. In some embodiments, the gate electrode 208 includes a work function metal layer that provides a metal gate with an n-type-metal work function or a p-type-metal work function. The p-type-metal work function materials include materials such as ruthenium, palladium, platinum, cobalt, nickel, conductive metal oxide, or other suitable materials. The n-type-metal work function materials include materials such as hafnium zirconium, titanium, tantalum, aluminum, metal carbides (e.g., hafnium carbide, zirconium carbide, titanium carbide, and aluminum carbide), aluminides, or other suitable materials. The gate dielectric layer 206 and the gate electrode 208 can collaboratively define the gate structures PO1-POX.

The spacer 210 can be disposed on the substrate 202 and on two opposite sides of the gate electrode 208. The spacer 210 can include dielectric materials, such as oxide, nitride, oxynitride and other dielectric materials. In some embodiments, the spacer 210 can include a multilayer structure, such as an oxide-nitride-oxide structure. Each of the gate structures PO1-POX can be spaced apart from each other by the spacer 210 and by other dielectric structures (not shown) filled between the spacers 210.

As shown in FIG. 5A, the transistor TG2 has a first terminal electrically connected to the active region OD2 and a second terminal electrically connected to the switching circuit TD. Each of the transistors TF1-TFX has a first terminal electrically connected to a corresponding gate structure PO1-POX and a second terminal electrically connected to the switching circuit TA.

As shown in FIG. 5A, each of the fuse elements (e.g., the fuse elements 1412-14X2) can be defined by an overlapping portion along the Z direction of the active region (e.g., the active region OD2), the gate dielectric layer 206 and the gate electrode 208.

Although not shown in FIG. 5A, it is contemplated that some conductive traces or conductive vias (not shown) can be electrically connected between the gate electrode 208 and the transistors TF1-TFX. Similarly, some conductive traces or conductive vias (not shown) can be electrically connected between the doped region 204 and the transistors TG1-TGX.

Figure 5B:
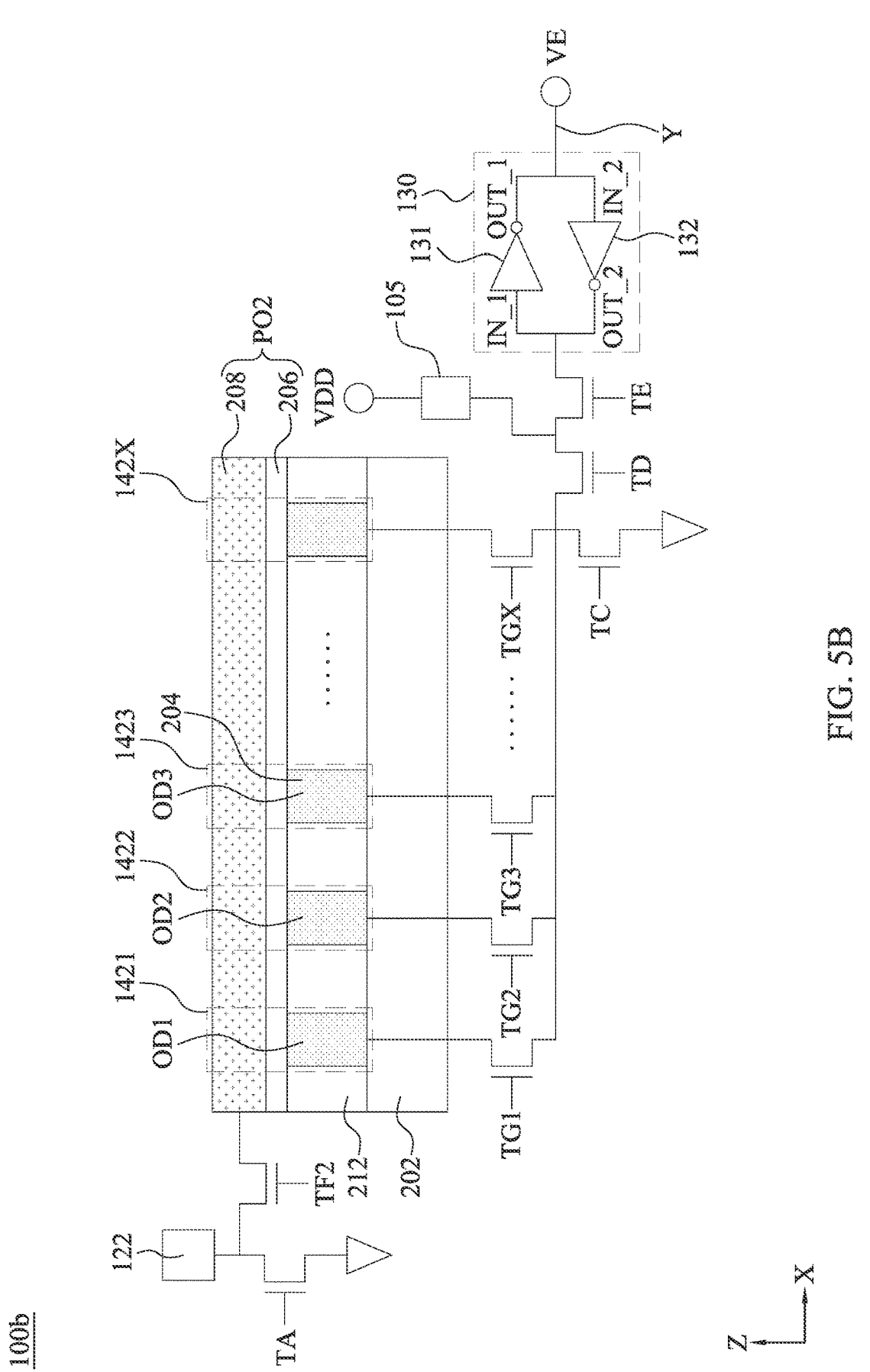
FIG. 5B illustrates a cross-sectional view along the line B-B' of the semiconductor device structure shown in FIG. 4, in accordance with some embodiments of the present disclosure.

FIG. 5B illustrates a cross-sectional view along the line B-B' of the semiconductor device structure 100b shown in FIG. 4, in accordance with some embodiments of the present disclosure.

As shown in FIG. 5B, the semiconductor device structure 100b can include isolation features 212 separating the plurality of active regions OD1-ODX from each other. In some embodiments, the isolation feature 212 can be a shallow trench isolation (STI) and be embedded in the substrate 202. The isolation feature 212 can include dielectric materials, such as oxide, nitride, oxynitride and other dielectric materials.

As shown in FIG. 5B, the gate structure PO2, including the gate dielectric layer 206 and the gate electrode 208, can be disposed on the plurality of active regions OD1-ODX. The transistor TF2 has a first terminal electrically connected to the gate structure PO2 and a second terminal electrically connected to the switching circuit TA. Each of the transistors TG1-TGX has a first terminal electrically connected to a corresponding active region OD1-ODX and a second terminal electrically connected to the switching circuit TD.

Figure 6:
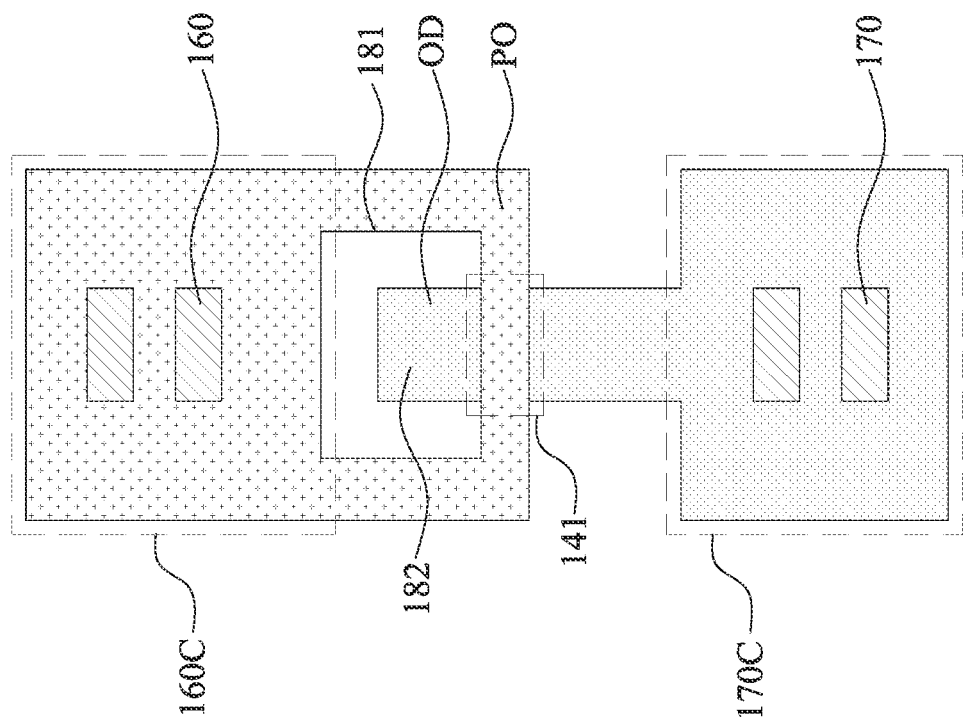
FIG. 6 illustrates a layout of a terminal of a semiconductor device structure, in accordance with some embodiments of the present disclosure.

FIG. 6 illustrates a layout of a terminal of a semiconductor device structure, in accordance with some embodiments of the present disclosure.

In some embodiments, the gate structure PO can have an opening 181 exposing a portion of the active region OD from a top view. In some embodiments, the active region OD can have a protruding portion 182 partially within the opening 181. The gate structure PO and the protruding portion 182 of the active region OD collaboratively form or define a fuse element 141. In some embodiments, at least one conductive terminal 160 can be electrically connected to the gate structure PO. In some embodiments, at least one conductive terminal 170 can be electrically connected to the active region OD. The gate structure PO includes a connection region 160C within which the at least one conductive terminal 160 is disposed. The active region OD includes a connection region 170C within which the at least one conductive terminal 170 is disposed. In some embodiments, the conductive terminal 160 can be electrically connected to a transistor (e.g., the transistor TF1-TFX). In some embodiments, the conductive terminal 170 can be electrically connected to a transistor (e.g., the transistor TG1-TGX). The conductive terminal 160 and/or 170 can include a conductive pad or other suitable structures.

Referring to FIG. 6, the connection region 160C occupies a region much more than that of the fuse element 141, and the connection region 170C occupies a region much more than that of the fuse element 141.

Figure 7:
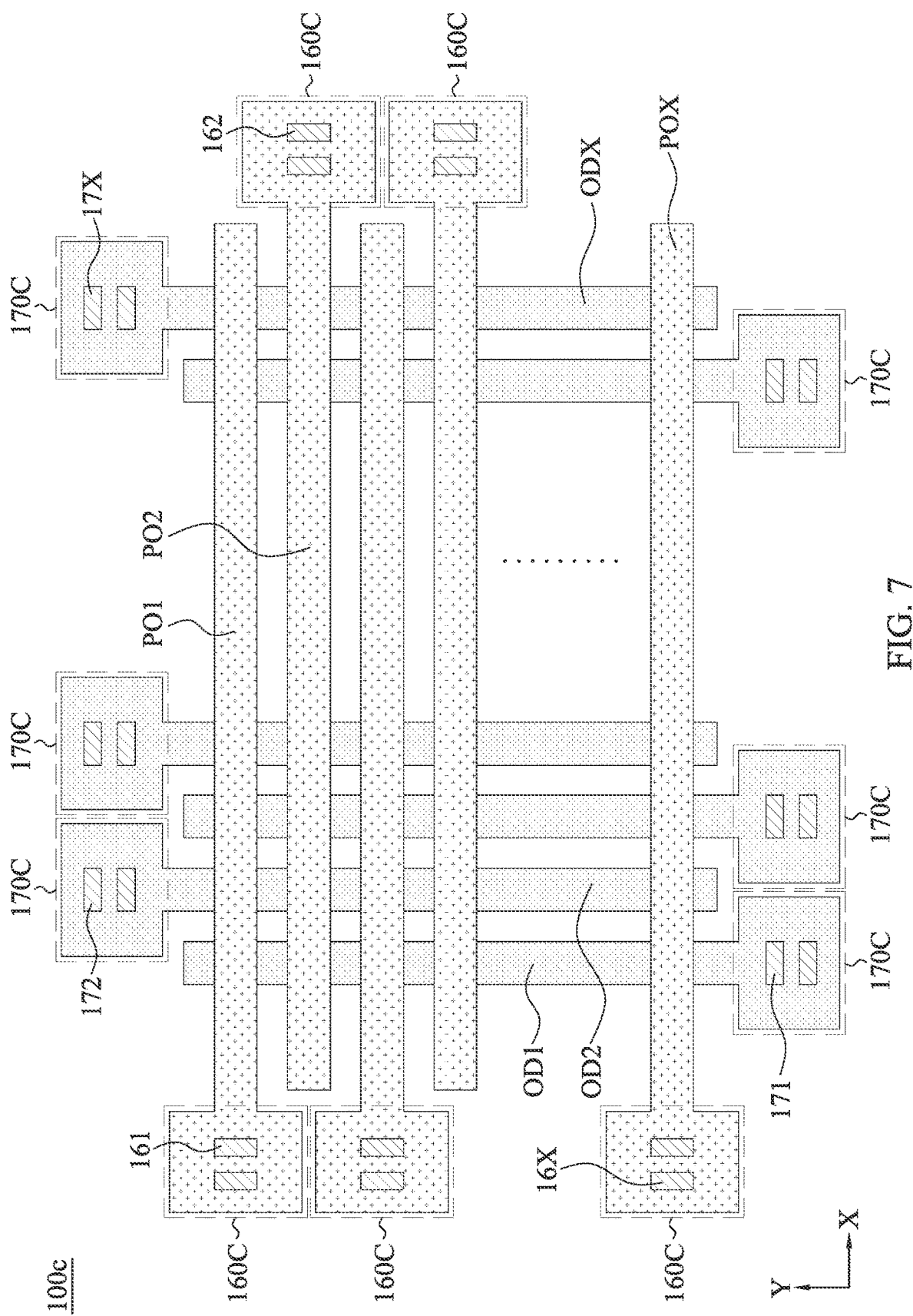
FIG. 7 is a schematic diagram of a layout of a semiconductor device structure, in accordance with some embodiments of the present disclosure.

FIG. 7 is a schematic diagram of a layout of a semiconductor device structure 100c, in accordance with some embodiments of the present disclosure.

As shown in FIG. 7, each of the gate structures PO1-POX can be electrically connected to a corresponding conductive terminal (e.g., conductive terminals 161, 162, . . . , or 16X). In some embodiments, the conductive terminals 161-16X can be alternatively disposed on two opposite sides of the active regions OD1-ODX along the X direction. For example, the conductive terminals 161 and 162 are disposed on two opposite sides of the active region OD1 along the X direction.

Each of the active regions OD1-ODX can be electrically connected to a corresponding conductive terminal (e.g., conductive terminals 171, 172, . . . , or 17X). In some embodiments, the conductive terminals 171-17X can be alternatively arranged on two opposite sides of the gate structures PO1-POX along the Y direction. For example, the conductive terminals 171 and 172 are disposed on two opposite sides of the gate structure PO1 along the Y direction.

In some embodiments, two adjacent connection regions 160C, on which the conductive terminals 161 and 162 are disposed, are disposed on two opposite sides of the active regions OD1-ODX along the X direction. For example, two adjacent connection regions 160C, on which the conductive terminals 161 and 162 are disposed, are disposed on two opposite sides of the active region OD1 along the X direction.

In some embodiments, two adjacent connection regions 170C, on which the conductive terminals 171 and 172 are disposed, are disposed on two opposite sides of the gate structures PO1-POX along the Y direction. For example, two adjacent connection regions 170C, on which the conductive terminals 171 and 172 are disposed, are disposed on two opposite sides of the gate structure PO1 along the Y direction.

As depicted above, the connection region 160C or connection region 170C occupies a region much more than that of the fuse element 141. Therefore, the arrangement shown in FIG. 7 can effectively utilize the area of the semiconductor device structure 100c, and thus the size of the semiconductor device structure 100c can be reduced.

One aspect of the present disclosure provides a semiconductor device structure. The semiconductor device structure includes a first gate structure, a second gate structure, and a first active region. The first gate structure extends along a first direction and is electrically connected to a first transistor. The second gate structure extends along the first direction and is electrically connected to a second transistor. The first active region extends along a second direction different from the first direction and across the first gate structure and the second gate structure. The first gate structure and the first active region collaboratively form a first fuse element. The second gate structure and the first active region collaboratively form a second fuse element.

Another aspect of the present disclosure provides a semiconductor device structure. The semiconductor device structure includes a plurality of fuse elements, a reference resistor unit, a first switching circuit, and a latch circuit. The reference resistor unit is configured to receive a first power signal and electrically couple with the plurality of fuse elements. The first switching circuit is configured to electrically connect the reference resistor unit and the plurality of fuse elements. The latch circuit is configured to read an evaluating signal of a first node between the reference resistor unit and one of the plurality of fuse elements.

Another aspect of the present disclosure provides a semiconductor device structure. The semiconductor device structure includes a plurality of fuse elements, a reference resistor unit, a first conductive terminal, a first switching circuit, and a second switching circuit. Each of the plurality of fuse elements has a first terminal and a second terminal. The reference resistor unit is configured to receive a first power signal and electrically couple with the first terminal of each of the plurality of fuse elements. The first conductive terminal is configured to receive a second power signal and is electrically connected to the second terminal of each of the plurality of fuse elements. The first switching circuit is configured to electrically couple the second terminal of each of the plurality of fuse elements to ground. The second switching circuit is coupled between the reference resistor unit and the ground. In response to the first power signal being applied to the reference resistor unit, and in response to the second power signal being applied to the first conductive terminal, the first switching circuit is configured to establish a first conductive path passing through the reference resistor unit and one of the plurality of fuse elements to the ground. The second switching circuit is configured to establish a second conductive path passing through one of the plurality of fuse elements to the ground.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A semiconductor device structure, comprising:
 a first gate structure extending along a first direction and electrically connected to a first transistor;
 a second gate structure extending along the first direction and electrically connected to a second transistor;
 a first active region extending along a second direction different from the first direction and across the first gate structure and the second gate structure; wherein the first gate structure and the first active region collaboratively form a first fuse element, the second gate structure and the first active region collaboratively form a second fuse element;
 a second active region extending along the second direction and across the first gate structure and the second gate structure, wherein the first active region is electrically connected to a third transistor, the second active region is electrically connected to a fourth transistor, the first gate structure and the second active region collaboratively form a third fuse element, and the second gate structure and the second active region collaboratively form a fourth fuse element,
 a reference resistor unit having a first terminal configured to receive a first power signal and a second terminal configured to electrically couple with the third transistor and the fourth transistor;

a first switching circuit configured to electrically connect the reference resistor unit with the third transistor and the fourth transistor;

a latch circuit configured to read an evaluating signal of a first node between the reference resistor unit and one of the first fuse element, the second fuse element, the third fuse element, and the fourth fuse element; and a second switching circuit configured to electrically couple the first transistor and the second transistor to ground, wherein in response to the first power signal being applied to the first terminal of the reference resistor unit, the first switching circuit and the second switching circuit are configured to establish a first conductive path passing through the reference resistor unit and one of the first fuse element, the second fuse element, the third fuse element, and the fourth fuse element to the ground.

2. The semiconductor device structure of claim 1, further comprising:

a first conductive terminal coupled to one of the first transistor and the second transistor and configured to receive a second power signal; and a third switching circuit coupled between the first node and ground, wherein the second switching circuit and the third switching circuit are configured to establish a second conductive path passing through one of the first fuse element, the second fuse element, the third fuse element, and the fourth fuse element to the ground.

3. The semiconductor device structure of claim 2, wherein the second power signal has a voltage in a range of 5-6V.

4. The semiconductor device structure of claim 2, further comprising:

a second conductive terminal coupled to one of the first transistor and the second transistor, wherein the first conductive terminal and the second conductive terminal are disposed on opposite sides of the first active region.

5. The semiconductor device structure of claim 1, further comprising: a fourth switching circuit coupled between the reference resistor unit and the latch circuit.

6. The semiconductor device structure of claim 1, wherein the first active region and the second active region are spaced apart from an isolation feature.

7. The semiconductor device structure of claim 1, wherein the first power signal has a voltage in a range of 1-1.5V.

8. The semiconductor device structure of claim 1, further comprising:

a third conductive terminal electrically connected to the first active region; and a fourth conductive terminal electrically connected to the second active region, wherein the third conductive terminal and the fourth conductive terminal are disposed on opposite sides of the first gate structure.

* * * * *